United States Patent [19]
Williams et al.

[11] Patent Number: 5,762,491
[45] Date of Patent: Jun. 9, 1998

[54] SOLID MATERIAL DELIVERY SYSTEM FOR A FURNACE

[75] Inventors: Dick S. Williams; William L. Luter, both of St. Charles, Mo.

[73] Assignee: MEMC Electronic Materials, Inc., St. Peters, Mo.

[21] Appl. No.: 551,152

[22] Filed: Oct. 31, 1995

[51] Int. Cl.[6] ................................................ F27B 14/00
[52] U.S. Cl. ........................ 432/156; 110/101 R; 110/106
[58] Field of Search ................................ 432/156, 157, 432/158, 159, 160, 161, 206; 126/343 SR; 110/101 R, 106

[56] References Cited

U.S. PATENT DOCUMENTS

| | | | |
|---|---|---|---|
| 2,253,707 | 8/1941 | Hoke | 432/156 |
| 3,248,206 | 4/1966 | Apple et al. | 432/156 |
| 4,052,153 | 10/1977 | Borer et al. | 432/156 |
| 4,055,391 | 10/1977 | Schmidt et al. | 432/156 |
| 4,313,386 | 2/1982 | Boldt et al. | 110/106 |
| 4,454,828 | 6/1984 | Zempel | 110/101 R |
| 4,513,671 | 4/1985 | Eshleman | 110/101 R |
| 5,416,795 | 5/1995 | Kaniuk et al. | 432/156 |

*Primary Examiner*—Henry A. Bennett
*Assistant Examiner*—Jiping Lu
*Attorney, Agent, or Firm*—Senniger, Powers, Leavitt & Roedel

[57] ABSTRACT

A solid material delivery system for a furnace which melts the solid material has a delivery tube located at least partially within the furnace which is mounted by a rotor assembly for selective radial positioning in the furnace over a crucible in the furnace. The rotor assembly is constructed to compensate for thermal expansion and contraction caused by the furnace so that free movement of the delivery tube is achieved at all operating temperatures. The rotor assembly is also constructed to prevent jamming caused by particulate solid material in the rotor assembly. The delivery tube is formed so that flowable solid material will flow in a controlled fashion but without clogging to an outlet. The delivery tube and outlet are shaped to drop the material in a substantially columnar stream into the crucible.

57 Claims, 7 Drawing Sheets

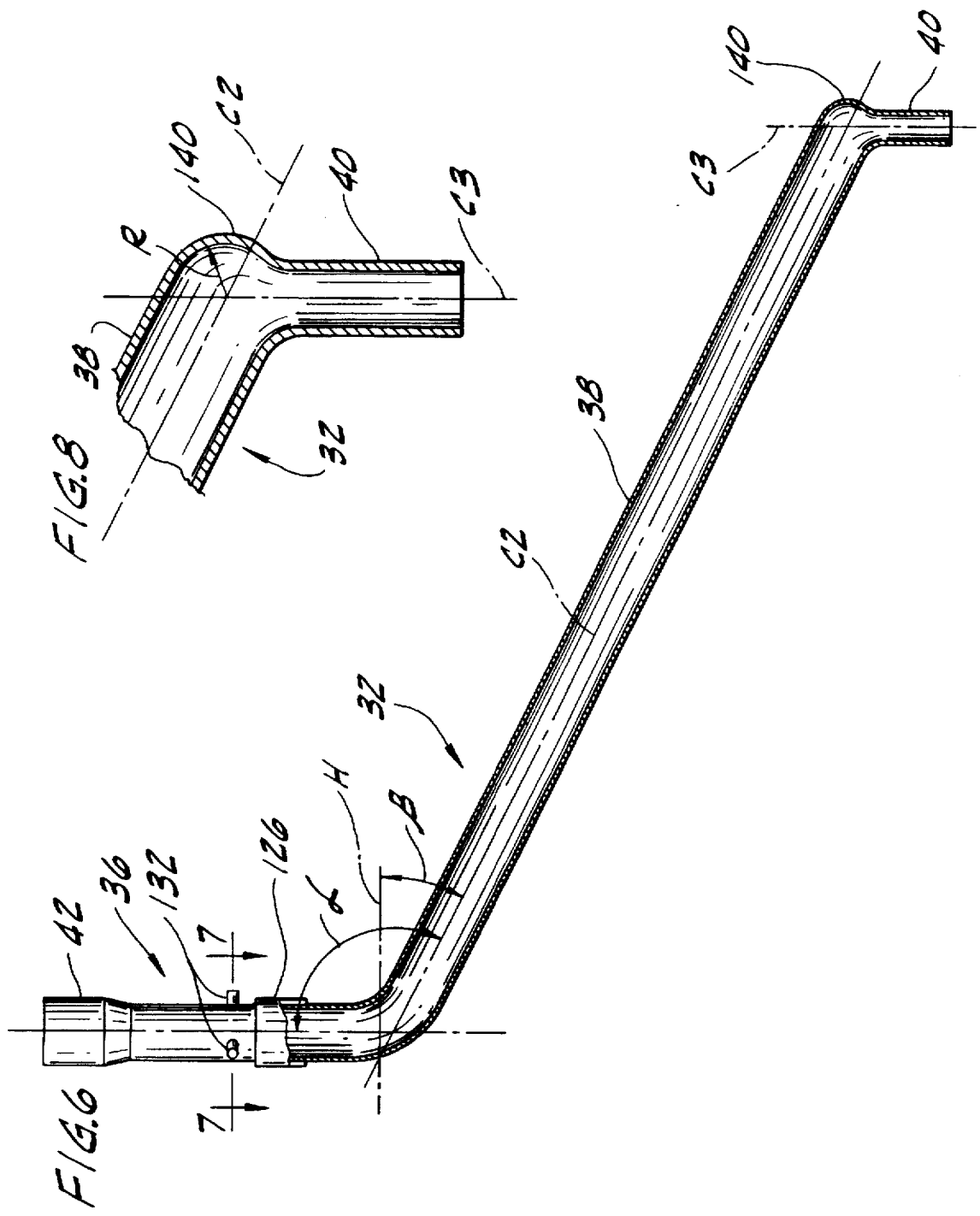

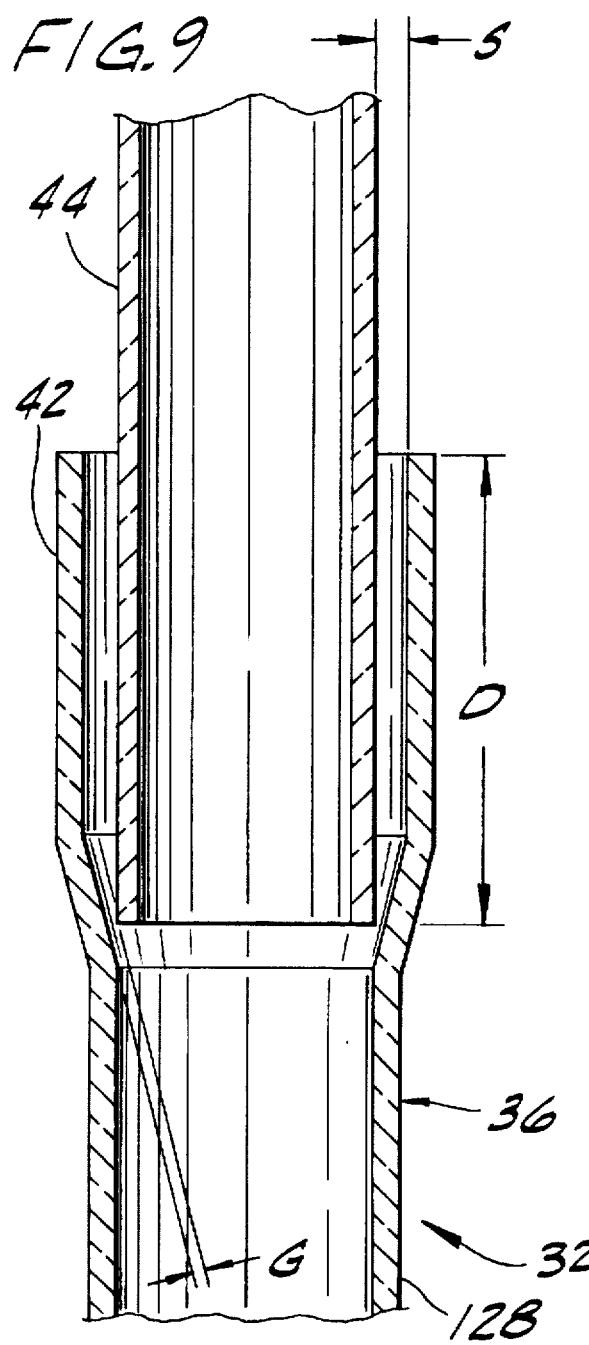
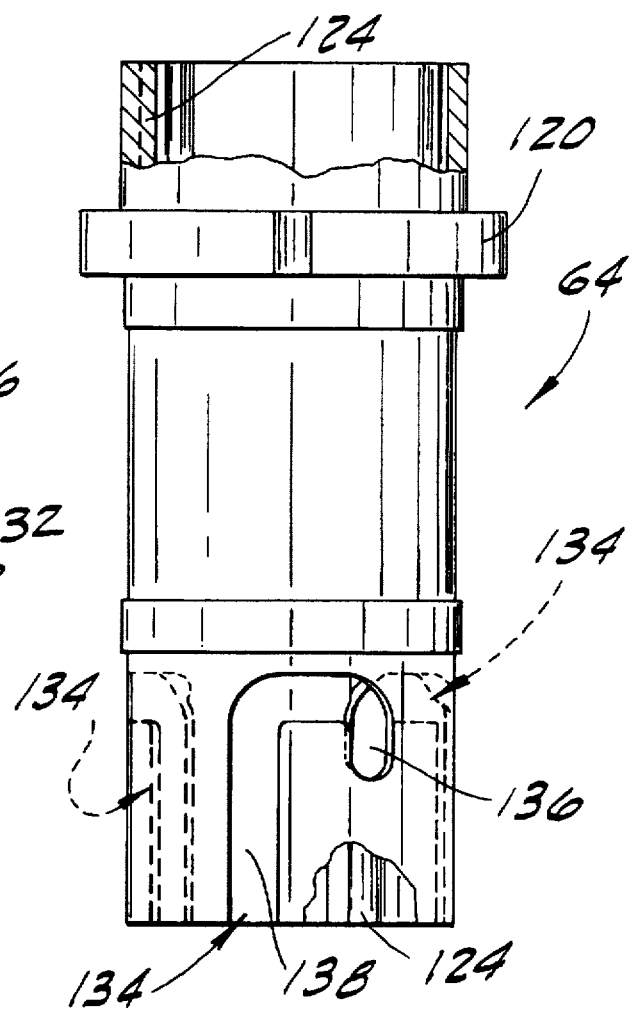

SOLID MATERIAL DELIVERY SYSTEM FOR A FURNACE

BACKGROUND OF THE INVENTION

This invention relates generally to material delivery systems for furnaces and more particularly to solid material delivery systems for feeding material to furnaces which melt the solid material.

The present invention has particular, though not exclusive application in the field of producing semiconductor material. The most common production technique for making semiconductor material is the Czochralski method in which high purity polysilicon source material is melted down in a crucible within a furnace (i.e., a crystal growing furnace) to form a melt. Once the melting process is complete a seed crystal mounted on the end of a pull wire is lowered down into engagement with the melt in the spinning crucible. The seed crystal is then slowly withdrawn to form an monocrystalline ingot from source material which solidifies around the seed.

The source material must be replenished or replaced after a certain volume has been removed to form one or more ingots. Replacement of the source material may be accomplished by shutting down the furnace, removing the crucible and remaining source material, and placing a new crucible in the furnace. New solid source material is placed in the crucible and melted down. It is better not to place all of the solid source material needed to form the melt in the crucible at one time. Some solid source material is preferably introduced to the crucible after melting has already commenced in the furnace. To accomplish this a delivery system extending into the furnace from a source of polysilicon outside the furnace is required.

Presently, there are delivery systems having fixed chutes which extend into the furnace over the open top of the crucible for delivering solid source material to the crucible. However, the fixed chutes must necessarily be located off to one side of the crucible because there must be room for the seed crystal to come down into contact with the melt in the center of the crucible, and for withdrawal of the ingot upward from the crucible. Thus, the solid material delivered by the chute is not delivered at or near the center of the crucible, which is most desirable when initially forming the melt.

There are also telescoping chutes which extend and retract within the furnace for positioning the end of the chute over the center of the crucible when forming the initial melt and withdrawing the chute from the center for the crystal pulling process. However, the telescoping chute is not capable of delivering solid source material to the melt at multiple radial locations at the same height within the furnace. For the solid material to flow down the chute, it must necessarily be angled downwardly toward the center of the furnace. Therefore, as the chute is retracted, its outlet end moves higher and higher above the melt. It is not desirable to deliver solid material from a location spaced too far above the melt because the solid material tends to splash as it enters the melt and the polysilicon tends to bounce out of the crucible. Thus, in practice the telescoping chute has no capability to deliver solid source material from selectively variable radial locations over the crucible. In order to operate, the telescoping chute requires the hopper holding the supply of solid source material to be located relatively high off the floor, making the hopper difficult to reach.

Replenishment of the melt can occur substantially at the same time the ingots are pulled from the melt, and involves the addition of solid, typically pelletized, source material (i.e., fluid bed polysilicon) to the melt during the course of crystal pulling and/or between consecutive crystal pulls. In this way, source material is replenished while the furnace is still in operation. Thus, the furnace does not have to be shut down and the crucible replaced as frequently. Of course, it is to be understood that replenishment is not an alternative to replacement of the melt, but rather may be used to extend the useful life of the melt before replacement is required.

Replenishment cannot be carried out by a delivery system which delivers solid source material only to a location over the center of the crucible. The central space must remain open for pulling the crystals. There are presently fixed chutes located over a radially outer portion of the open top of the crucible. However, these chutes have no flexibility for use in replacement of the melt in which it is better to feed the solid source material near the center of the crucible.

Thus, there is presently a need for a solid source material delivery system which permits solid source material to be fed at the same height, but at different radial positions over the crucible. In addition, there is also need for a delivery system in which the flow of solid source material does not jam, and in which the solid material has substantially only a vertically downward velocity component as it is dropped into the crucible.

SUMMARY OF THE INVENTION

Among the several objects and features of the present invention may be noted the provision of a delivery system which is capable of selective adjustment to vary the radial location at which solid source material is dropped into the crucible; the provision of such a delivery system which is capable of radial adjustment while maintain the same height over the crucible; the provision of such a delivery system which is capable of radial adjustment despite substantial temperature variation of components permitting radial adjustment; the provision of such a delivery system which has a significantly reduced tendency to jam as a result of particle and dust collection in moving components of the delivery system; the provision of such a delivery system which permits the particles and dust to flow through the moving components; the provision of such a delivery system which substantially contains particulate solid material within feed and delivery tubes; and the provision of such a delivery system which is easy to use.

Generally, a furnace system for use in melting a solid material constructed according to the principles of the present invention comprises a furnace shell for substantially isolating the interior of the furnace shell. A crucible disposed within the furnace shell for holding the solid material to be melted is constructed for receiving material through the top thereof. A heat source in the furnace shell heats the crucible and melts the solid material. A solid material delivery system for feeding flowable solid material comprises a delivery tube at least partially disposed within the furnace shell generally above the crucible. The delivery tube has an outlet and is constructed for receiving the solid material from a source outside the furnace shell. Means mounts the delivery tube for swinging motion relative to the furnace shell, by which swinging motion the radial position of the delivery tube outlet relative to the top of the crucible is selectively changed. An actuator actuates the swinging motion of the delivery tube to selectively radially position the delivery tube outlet.

In another aspect of the present invention, a delivery tube comprises an upper end portion having a centerline and an angled portion having a centerline extending laterally outwardly from the upper end portion at an angle. The angle between the centerline of the upper end portion and the centerline of the angled portion is 90° plus an amount greater than the angle of repose of the solid material.

In still another aspect of the present invention, a delivery tube comprises an upper portion, an angled portion extending laterally outwardly at an angle from the upper portion, and an outlet portion extending generally downwardly at an angle from the angled portion. The ratio of the length to the diameter of the outlet portion being at least about 1.

In yet another aspect of the present invention, a delivery tube comprises an upper portion, an angled portion extending laterally outwardly at an angle from the upper portion, and an outlet portion extending generally downwardly at an angle from the angled portion. The angled portion has a bulbous end extending beyond the outlet portion.

Other objects and features of the present invention will be in part apparent and in part pointed out hereinafter.

BRIEF DESCRIPTION OF THE DRAWINGS

FIG. 6 is an elevational view of a delivery tube of the delivery system with parts broken away to show internal construction;

FIG. 8 is a fragmentary vertical section of the delivery tube showing its outlet end;

FIG. 9 is an enlarged, fragmentary view of a feed tube of the delivery system docked in the delivery tube; and FIG. 10 is an elevation of a sleeve of the delivery system with parts broken away to show internal construction.

Corresponding reference characters indicate corresponding parts throughout the several views of the drawings.

DETAILED DESCRIPTION OF THE PREFERRED EMBODIMENT

Figure 1:
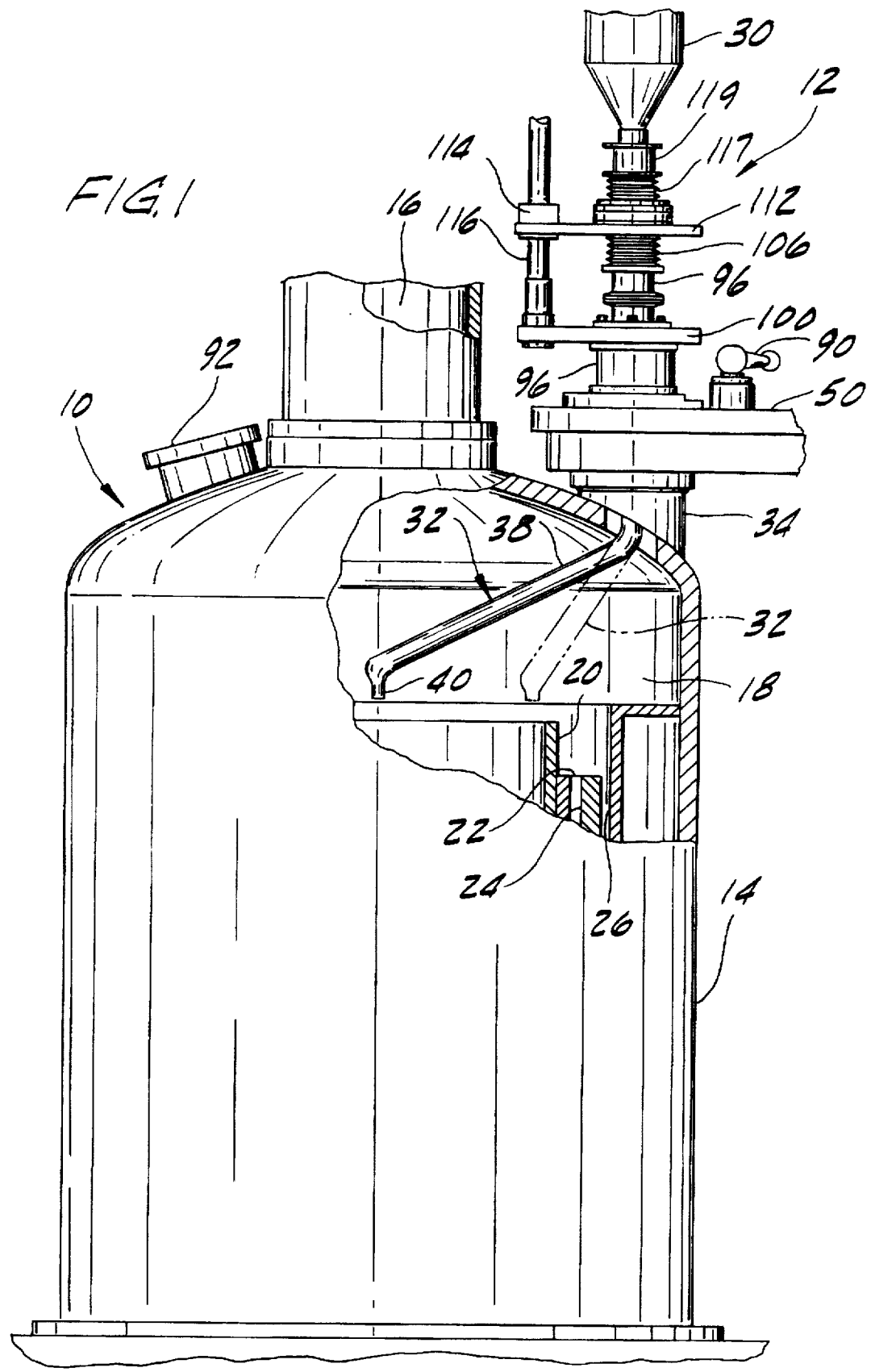
FIG. 1 is a schematic front elevational view of a furnace system including a solid material delivery system, with parts of a shell of the furnace system broken away to reveal internal construction.

Referring now to the drawings, and in particular to FIG. 1, a crystal growing furnace, indicated generally at 10, is shown which is of the type used to grow monocrystalline semiconductor ingots (not shown) which are processed to produce semiconductor wafers. A solid material delivery system (indicated generally at 12) attached to the crystal growing furnace is capable of feeding high-purity polysilicon in pellet or granular form to the furnace 10. The embodiment described herein will refer to the use of fluid bed polysilicon. However, it is to be understood that other granular forms of polysilicon which are capable of flow may be used. Together, the furnace 10 and delivery system 12 constitute a furnace system in the preferred embodiment. It is to be understood that although the preferred embodiment described herein relates to semiconductor production, the principles of the invention have broader application.

The crystal growing furnace 10 includes a shell 14 which is capable of substantially isolating the interior of the furnace from the surrounding environment. There is defined within the shell 14 a pulling chamber 16 and a crystal growth chamber 18 which can be isolated from each other. A crucible 20 in the crystal growth chamber 18 is capable of holding solid polysilicon and the melt formed by the melted silicon. The crucible 20 is preferably made of quartz so as not to contaminate the polysilicon held in the crucible, and the top of the crucible is open for receiving the solid silicon into the crucible. The crucible 20 is carried by a turntable 22 for rotation in the shell 14. A graphite heater and a thermal shield adjacent to the crucible 20 and turntable 22 in the growth chamber 18 are schematically shown at 24 and 26, respectively, in FIG. 1. The furnace 10 as described to this point is of the type which is well known in the art for single crystal silicon crystal growth by the Czochralski method. An example of such a furnace is the Hamco model 2000CG, Manufactured by Kayex Corporation, a unit of General Signal Corporation, Rochester, N.Y.

The fluid bed polysilicon delivery system 12 delivers polysilicon from a storage hopper 30 through the shell 14 of the crystal growing furnace 10 and to the crucible 20. The hopper 30 is of known construction, having the capability to meter the flow of polysilicon from the hopper and providing protection (e.g., as by quartz lining) for purity of the polysilicon in the hopper. Thus, only an outlet portion of the hopper 30 is illustrated in the drawings. The delivery system 12 and the hopper 30 are capable of being isolated from the surrounding environment to prevent contamination of the melt or the atmosphere in the furnace 10. The fluid bed polysilicon, although solid, is capable of gravity flow from the hopper 30 through the delivery system 12 to the crucible 20.

Figure 2:
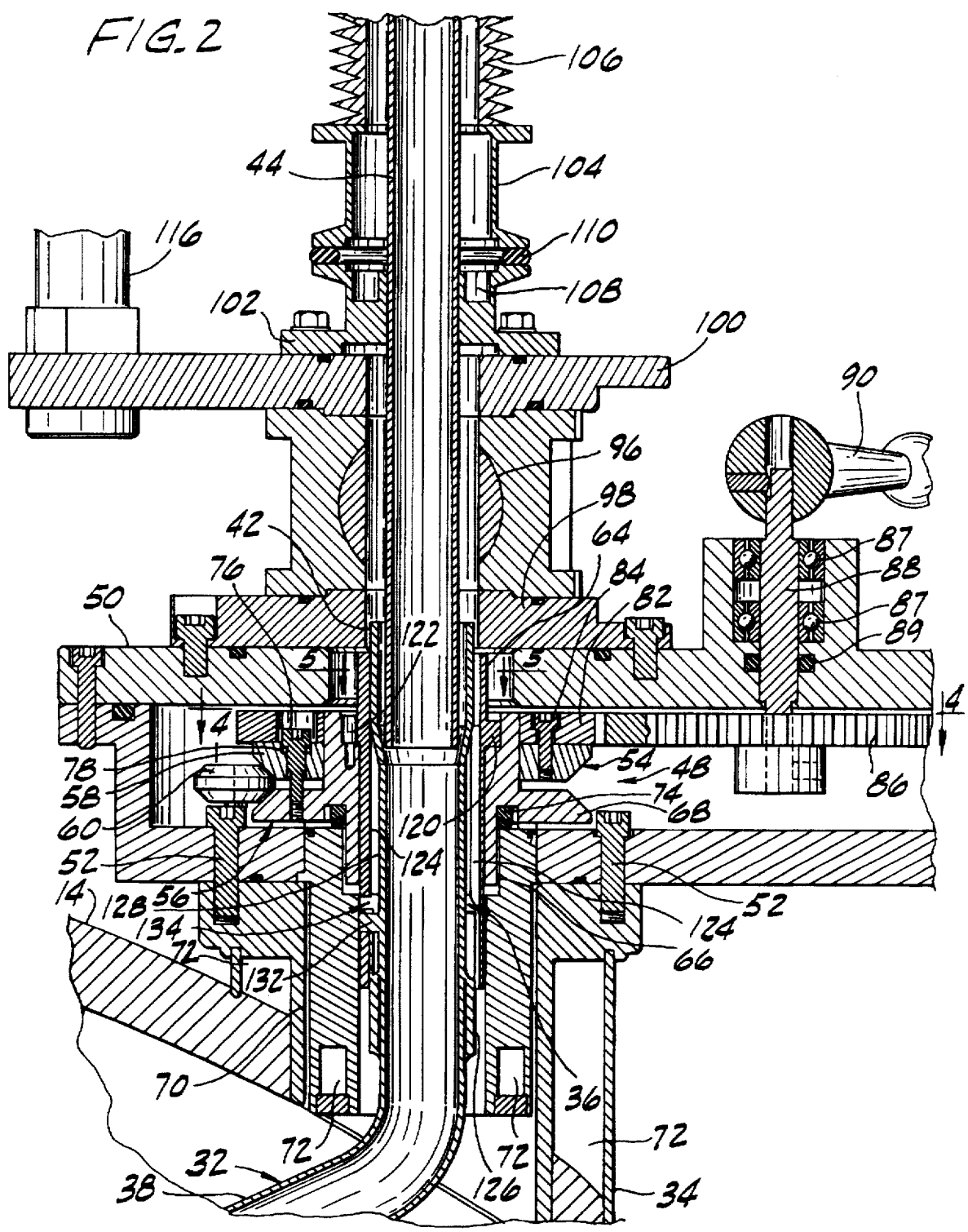
FIG. 2 is an enlarged fragmentary vertical section of the furnace system showing details of the delivery system in a material feed configuration.

Referring now to FIGS. 1 and 2, the delivery system 12 is shown to comprise a delivery tube, generally indicated at 32, which extends from a location outside the shell 14 of the crystal growing furnace 10 through a port 34 in the furnace and into its interior. The delivery tube 32 has an upper portion (indicated generally at 36), an angled portion 38 extending at an angle from the upper portion, and an outlet portion 40 (FIG. 8). The outlet portion 40 is disposed over the open top of the crucible 20 for dropping the fluid bed polysilicon into the crucible. An upper end 42 of the delivery tube 32 is flared outwardly in a bell shape for receiving a lower end portion of a feed tube 44 which extends upward to the hopper 30 for feeding fluid bed polysilicon to the delivery tube from the hopper. The delivery tube 32 is made of quartz in the preferred embodiment, but may be made of silicon or other suitable materials depending upon the particular application. The feed tube 44 is made of quartz, but could also be made of other suitable materials such as silicon or silicon coated graphite.

Figure 4:
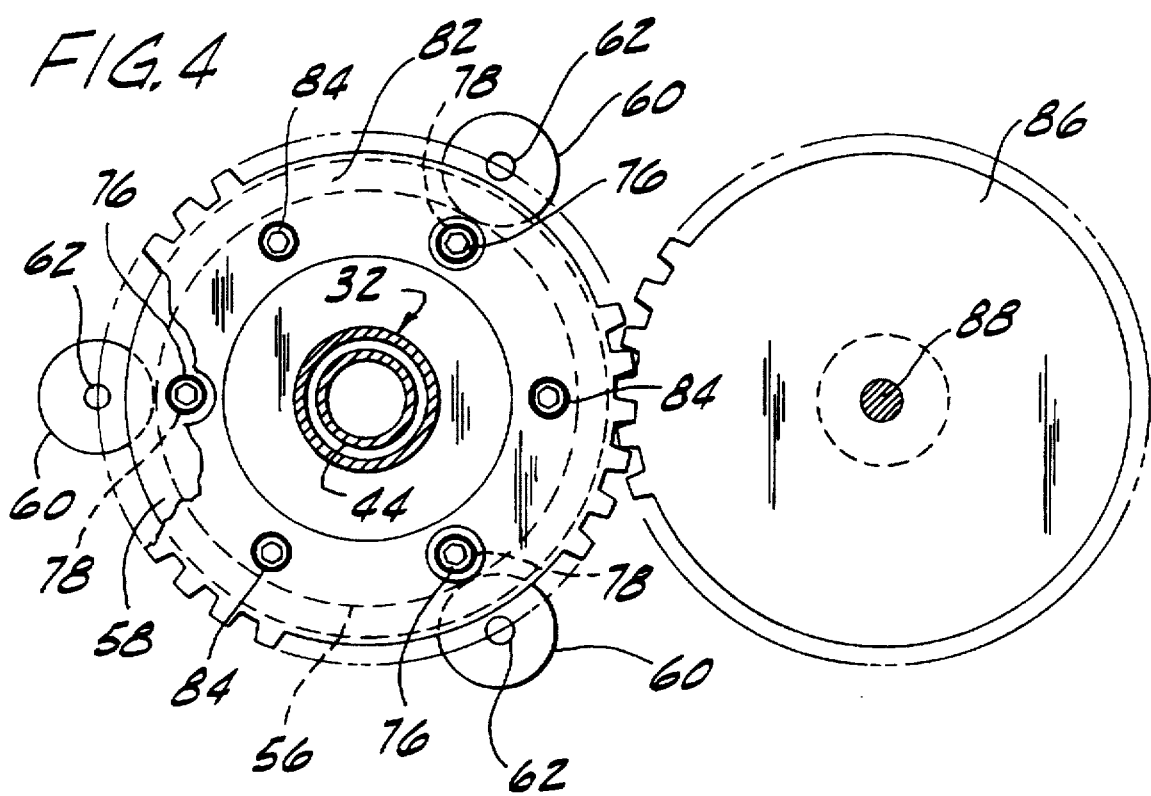
FIG. 4 is a schematic plan view of a gear plate and drive gear of the delivery system as seen from the vantage indicated by line 4—4 of FIG. 2.

A rotor assembly (designated generally at 48) located in a rotor assembly housing 50 mounts the delivery tube 32 for swinging motion relative to the shell 14 about a generally vertical axis. The swinging motion permits the radial position of the outlet portion 40 of the delivery tube 32 with respect to the crucible 20 to be selectively changed, as illustrated by the solid line and phantom line delivery tubes shown in FIG. 1. The rotor assembly housing 50 is mounted on the port 34 by suitable fasteners such as bolts 52. The rotor assembly 48 includes a rotor, indicated generally at 54, comprising a first sheave 56 and a second sheave (indicated in its entirety by reference numeral 58) defining a space between them which receives a peripheral edge margin of three bearing rollers 60 spaced around the rotor (FIG. 4). The bearing rollers 60 are mounted on the rotor assembly housing 50 for rotation relative to the housing on axles 62 having substantially parallel axes, which permits the rotor 54 to turn about its central axis relative to the housing. In the preferred embodiment the bearing rollers 60 are made of a robust high temperature plastic, although other suitable materials may be substituted. The delivery tube 32 is connected by a sleeve, indicated generally at 64, to the first sheave 56 (as described more fully hereinafter) for conjoint rotation with the rotor 54.

The first sheave 56 has a central, tubular hub portion 66 and an outwardly projecting annular flange 68 lying in opposed relation to the second sheave 58. The second sheave slidably receives an upper part of the hub portion 66 through its central opening. A lower part of the hub portion 66 extends into a counterbore in a tubular adapter 70 mounted in the port 34 of the shell 14. The adapter 70 is welded to the roller assembly housing 50 and constitutes part of the housing. The adapter 70 and the port 34 have channels 72 through which a cooling liquid is circulated. A sealing ring 74 received in a groove on the underside of the flange 68 of the first sheave 56 permits the first sheave to turn relative to the rotor assembly housing 50 while maintaining a seal with the adapter 70

The second sheave 58 is connected to the first sheave 56 by fasteners 76 (only one is shown) which extend through a hole in the second sheave and are free of fixed connection to the second sheave. The lower end of each fastener 76 is threadedly received in a hole in the first sheave 56 for fixed connection to the first sheave. A belleville washer 78 received in a counterbore in the hole in the second sheave 58 biases the head of the fastener 76 upward, which draws the first and second sheaves 56, 58 toward one another to squeeze the bearing rollers 60. Multiple belleville washers (not shown) may be placed in the counterbore under the head of the fastener 76 if a greater range of motion of the first and second sheaves 56, 58 is desired. It is to be understood that spring elements other than belleville washers could be used without departing from the scope of the present invention. The peripheries of the first and second sheaves and of the bearing rollers 60 are bevelled in a complementary fashion for rolling engagement of the sheaves 56, 58 with the bearing rollers. Thus if the rotor 54 expands because of heat from the furnace 10, the sheaves 56, 58 are capable of compensating by moving further apart against the spring force of the belleville washers 78 so that the rotor does not become jammed against the bearing rollers 60. The axis of rotation of the rotor 54 remains fixed (i.e., coaxial with the centerline of the upper portion 36 of the delivery tube 32) by the position of the bearing rollers 60 without regard to expansion and contraction of the rotor.

A gear plate 82 rigidly connected to the second sheave 58 by bolts 84 (only one is shown) is enmeshed with a drive gear 86 mounted on the lower end of a shaft 88. The shaft 88 is mounted by bearings 87 on the rotor assembly housing 50 for rotation relative to the housing. An O-ring 89 mounted in a groove in the rotor assembly housing 50 maintains a vacuum seal with the shaft 88. The shaft 88 extends outside of the rotor assembly housing 50 where is it connected at its upper end to a handle 90 disposed to be gripped and turned by an operator (not shown). The handle 90 and drive gear 86 constitute an "actuator" in the illustrated embodiment. The delivery tube 32 may be swung to a selected radial position over the crucible 20 by turning the handle 90. The position of the delivery tube 32 over the crucible 20 in the shell 14 of the furnace 10 can be established visually through a view port 92 in the shell (FIG. 1), or by markings (not shown) applied to the exterior of the rotor assembly housing 50 under the handle 90.

The rotor assembly 48 not only is capable of compensating for thermal expansion and contraction, but is constructed to avoid jamming caused by collection of dust and particulates from the fluid bed polysilicon. When the delivery system 12 is periodically shut off, the crystal growing furnace is isolated from the hopper by a ball valve 96 mounted by a plate 98 on the rotor assembly housing 50. In the open position of the delivery system 12, the feed tube 44 extends through the ball valve 96 and is docked in the bell shaped upper end 42 of the delivery tube 32. To close the delivery system 12 and isolate the furnace 10 from the hopper, the feed tube 44 is withdrawn axially from the delivery tube 32 to a location just above the ball valve 96.

Figure 3:
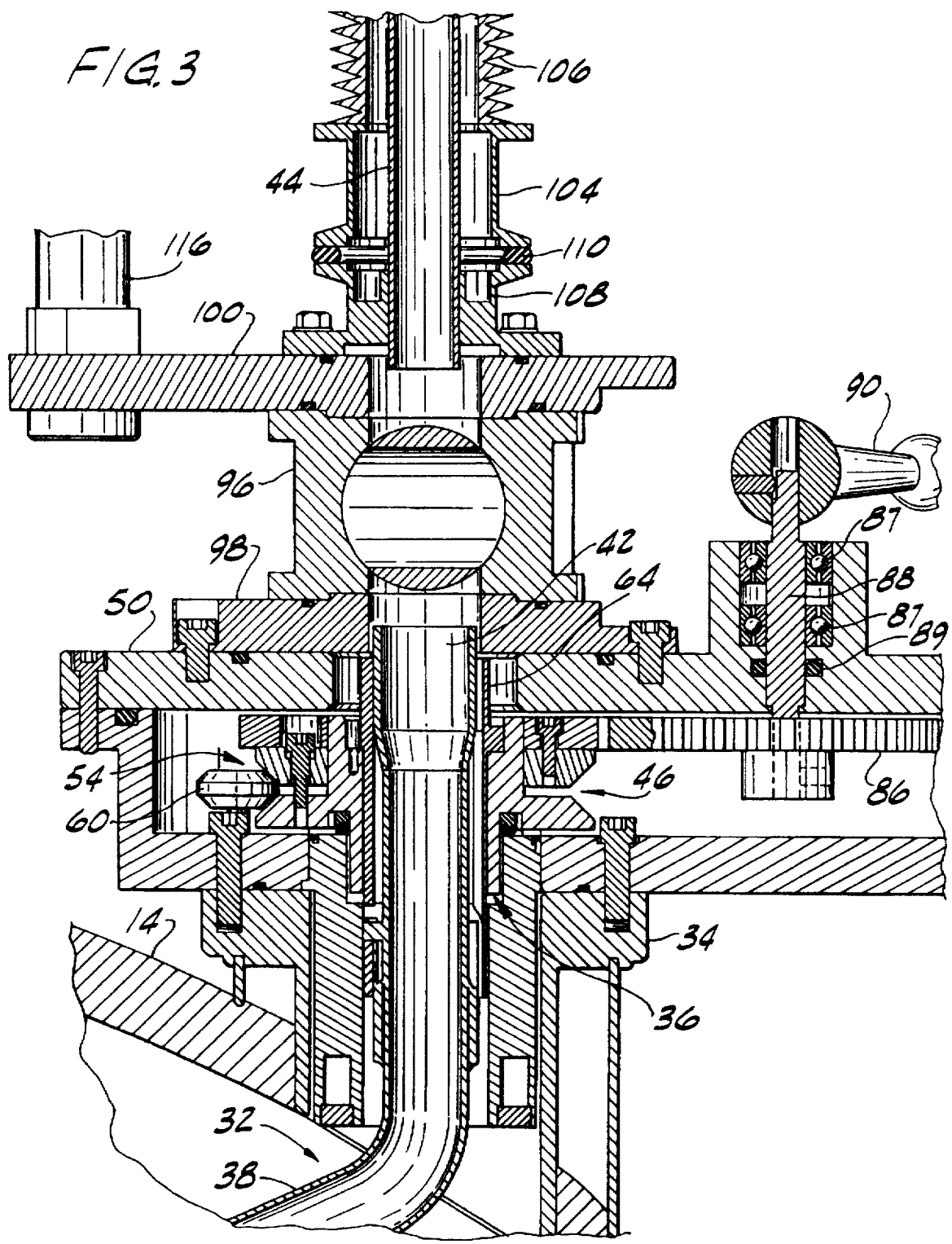
FIG. 3 is an enlarged fragmentary vertical section of the furnace system showing the delivery system in a closed configuration.

The feed tube 44 extends upwardly out of the ball valve 96 through an alignment plate 100, a fitting 102 and a tube member 104 into a longitudinally expansible and contractible bellows 106. The fitting 102 has an annular groove 108 around the feed tube 44 which acts as a spill trap to catch dust and escaped fluid bed polysilicon to prevent the feed tube from jamming. The fitting 102 is sealingly connected to the tube member 104 by a seal ring 110. The upper end (not shown) of the feed tube 44 is operatively connected to a carry plate 112 (FIG. 1) for movement with the carry plate axially of the feed tube. The carry plate 112 is connected by a slider 114 to an alignment rod 116 mounted at its lower end to the alignment plate 100. Above the carry plate 112 the feed tube extends through another bellows 117 and another fitting 119 connected to the hopper 30. The carry plate 112 is capable of being moved up and down by an actuator (not shown) connected to the slider 114 to move the feed tube 44 between a docked position in the delivery tube 32 (FIG. 2) and an undocked position spaced just above the ball valve (FIG. 3). The bellows 106 lengthens and shortens to isolate the feed tube 44 while permitting its axial motion.

Operation of the ball valve 96 and rotor assembly 48 is sensitive to the presence of dust and polysilicon pellets. The joint between the feed tube 44 and delivery tube 32 is a primary site for escape of polysilicon into the ball valve 96 and/or rotor assembly 48. Quartz cannot be held to close tolerances, so that some significant space must be left between the end of the feed tube 44 and the interior wall of the delivery tube 32. The minimum space between the feed tube 44 and delivery tube 32 should be sufficiently large to permit the largest granular fluid bed polysilicon size to fall back down into the delivery tube. The dust and particles escaping from the upper end 42 of the delivery tube 32 should preferably be reduced as much as possible. Thus, the distance which the feed tube 44 extends into the delivery tube 32 has been selected to minimize escape of dust from the joint. Fluid bed polysilicon is highly elastic so that it is difficult to contain when put in motion. As shown in FIG. 9, the distance D the feed tube 44 is inserted into the upper end 42 of the delivery tube 32 is preferably about 30 times the maximum radial spacing S between an exterior surface of the feed tube and an interior surface of the delivery tube. In the illustrated example, the maximum radial spacing S is about 2.5 mm and the distance D the feed tube 44 is inserted into the delivery tube 32 is approximately 75 mm. The maximum radial spacing S is preferably selected to be greater than the maximum particle size of the material being fed through the delivery tube 32.

A gap G between the lower end of the feed tube 44 and the angled interior surface of the upper end 42 is preferably minimized. However, tolerances inherent in the present technology for forming quartz components prevents the gap from being zero. Preferably the gap G should be smaller than the smallest particle size, which is roughly one-tenth the size of the largest particle. Stated another way, the size of the gap G is approximately equal to one-tenth the size of the maximum radial spacing S. Of course, the polysilicon will include dust and other particles having a smaller size, but the gap should be smaller than the smallest formed pellet size of the polysilicon. In the preferred embodiment, the external diameter of the feed tube is approximately equal to the internal diameter of the delivery tube below the upper end, less an amount equal to the tolerance for the material of the delivery tube.

Figure 5:
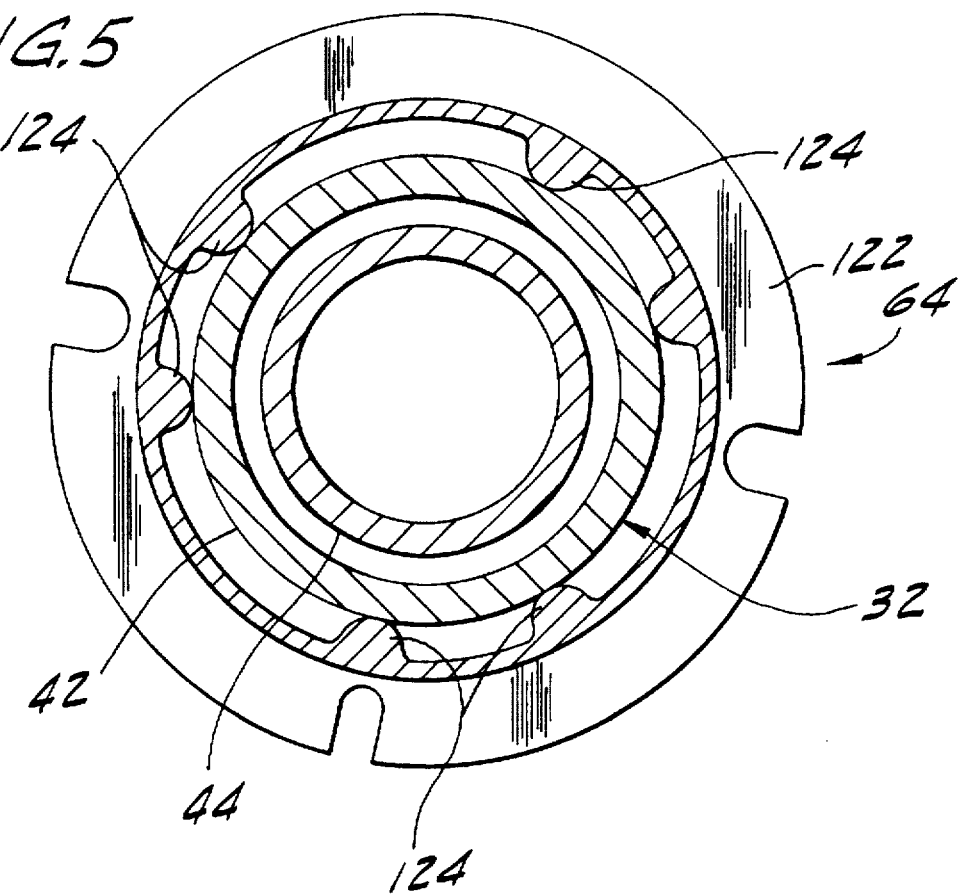
FIG. 5 is a section taken in the plane including line 5—5 of FIG. 2.

It is inevitable that some of the fluid bed polysilicon will escape from the feed tube 44 and delivery tube 32. Should the escaped polysilicon collect between the quartz delivery tube 32 and some fixed component of the delivery system 12, the delivery tube will become jammed, preventing its radial adjustment. The present invention permits the dust to fall through the rotor assembly 48 rather than collect in the rotor assembly around the delivery tube 32. In that regard, the sleeve 64 is constructed for holding the delivery tube 32 for conjoint rotation while permitting fluid bed polysilicon to flow through the rotor assembly 48 between the sleeve and the delivery tube. The sleeve 64 has a flange 120 near its upper end which rests in a counterbore in the hub portion 66 of the first sheave 56, and is connected by screws 122 (only one is shown) to the hub portion. As may be seen in FIG. 5, the sleeve 64 has spaced apart internal ribs 124 extending generally longitudinally of the sleeve. The ribs 124 engage parts of the upper portion 36 of the delivery tube 32 with a very small surface area engagement. As may be seen in FIG. 5, adjacent ribs 124 define between them relatively large spaces for escaped fluid bed polysilicon to pass through the sleeve 64 between the delivery tube 32 and the sleeve.

The delivery tube 32 is formed to facilitate the flow of escaped fluid bed polysilicon while achieving a firm connection to the rotor assembly 48. The internal ribs 124 of the sleeve 64 engage the delivery tube 32 at two axially spaced locations on the upper portion 36. The first location is on the outer surface of the bell shaped upper end 42 of the delivery tube 32. The second location is on the outer surface of a lower portion 126 formed in a suitable manner such as by fusing a quartz ring onto the delivery tube 32. Although the outside diameter of the delivery tube 32 varies along its upper portion 36, the internal diameter below the upper end 42 remains substantially constant to the outlet portion 140. An intermediate portion 128 between the bell shaped upper end 42 and the lower portion 126 has a smaller outer diameter and does not contact the ribs 124. Contact of the ribs 124 with the delivery tube 32 at two spaced apart locations helps the sleeve 64 to hold the upper portion 36 in an upright position and to prevent canting of the delivery tube in the rotor 54. However, substantial space is provided between most of the overlying areas of the delivery tube 32 and sleeve 64 to permit fluid bed polysilicon to flow through the sleeve outside the delivery tube.

Figure 7:
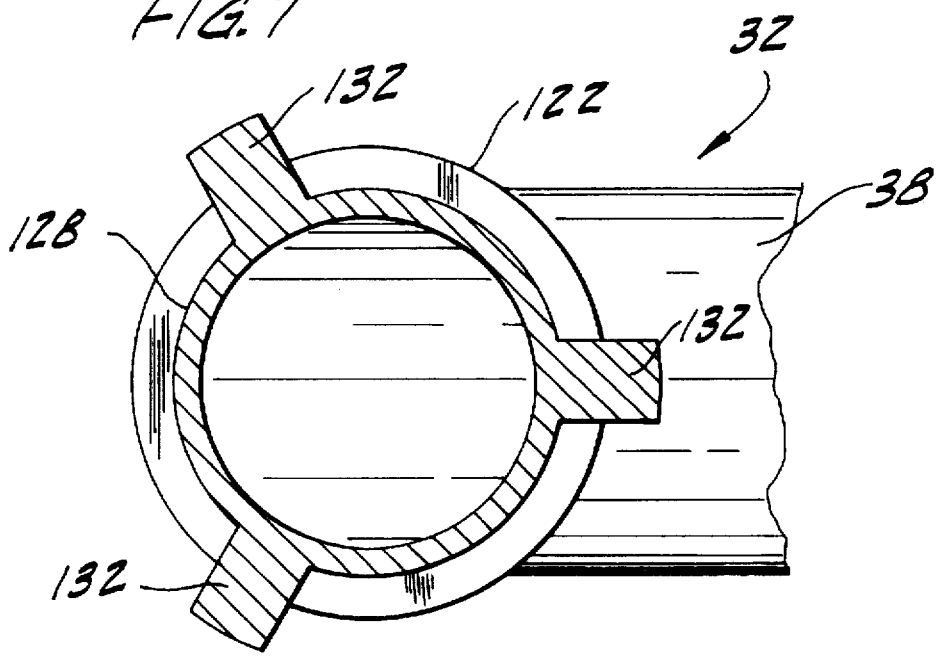
FIG. 7 is a section taken in the plane including line 7—7 of FIG. 6.

Releasable connection of the delivery tube 32 to the sleeve 64 is achieved using a bayonet connection having connector elements comprising three radially projecting pegs 132 on the delivery tube (FIG. 7), and three inverted-J shaped slots (indicated generally at 134) in the lower end of the sleeve (FIG. 10). The pegs 132 are located on the intermediate portion of the delivery tube 32 at angularly spaced locations around the delivery tube, and rest in a toe portion 136 of the inverted-J slots 134 when installed in the sleeve 64. To remove the delivery tube 32 from the sleeve 64, it is lifted up to move the pegs 132 out of the toe portions 136, turned to move the pegs into alignment with straight portions 138 of the slots, and then dropped down out of the sleeve. Connection of a new delivery tube to the sleeve 64 is accomplished by reversing the foregoing steps.

The delivery tube 32 is constructed to facilitate flow of fluid bed polysilicon without clogging or leakage of polysilicon, and to drop the polysilicon in a substantially columnar stream from its outlet portion 40. The substantially constant internal diameter of the delivery tube 32 below the upper end 42 helps to prevent the highly elastic polysilicon from rebounding out of the delivery tube through its open upper end. Changes in internal diameter would provide surfaces facing the direction of flow of the polysilicon through the tube 32, permitting the polysilicon to rebound off of these surfaces. In the illustrated embodiment, the internal diameter of the delivery tube 32 does not vary substantially from the upper end 42 to the outlet portion 40. However, preferably the internal diameter should remain constant for a distance greater than the distance a polysilicon particle will rebound when dropped from the hopper 30 (e.g., approximately 10 or more internal diameters).

As shown in FIG. 6, the upper portion 36 of the delivery tube has a centerline C1 which is oriented generally vertically when the delivery tube is installed in the rotor assembly 48. A centerline C2 of the angled portion 38 extends laterally outwardly from the centerline C1 of the upper portion 36 at an angle $\alpha$. The angle $\alpha$ between the centerlines is equal to 9020 plus an amount somewhat greater than the angle of repose of the fluid bed polysilicon. The angle of repose is the greatest angle at which the material will support itself before beginning to flow, which for fluid bed polysilicon is roughly 26°. The angle $\beta$ the angled portion 38 makes with the horizontal (represented by line H) is preferably selected to be greater than the angle of repose, but less than the angle of repose plus about 10°. The angle $\beta$ more preferably exceeds the angle of repose by an amount less than about 5° and most preferably exceeds the angle of repose by an amount less than about 220 . Thus the angled portion 38 is constructed so that when held by the rotor assembly 48, the fluid bed polysilicon in the angled portion is supported at an angle $\beta$ from horizontal at which it just barely begins to flow down the angled portion.

Referring now to FIG. 8, the outlet portion 40 of the delivery tube 32 has a centerline C3 extending generally downward at an angle to the centerline C2 of the angled portion 38. Preferably, the outlet portion centerline C3 is oriented generally vertically. As may be seen, the outlet portion 40 projects downward significantly from the end of the angled portion 38. The ratio of the length to the diameter of the outlet portion 40 should be at least about 1 and preferably somewhat exceed that ratio. The elongation of the outlet portion 40 permits it to redirect the fluid bed polysilicon for substantially columnar flow out of the delivery tube 32 to the crucible 20.

Control of the flow of fluid bed polysilicon is also facilitated by a bulbous end 140 on the angled portion 38 of the delivery tube 32. The bulbous end 140 is a generally spherical section having a center at the intersection of the centerline C2 of the angled portion 38 and the centerline C3 outlet portion 40, and having a radius R equal to the internal radius of the angled portion. The size and shape of the bulbous end 140 helps to redirect the fluid bed polysilicon to have almost exclusively a downward velocity, and also inhibits clogging at the outlet portion 40.

A polysilicon melt is initially formed in the crucible 20 by placing relatively large chunks of polysilicon in the crucible. The interior of the crystal growing furnace shell 14 is evacuated to a vacuum pressure and an inert gas such as argon is circulated through the interior. The graphite heater 24 is activated to heat the chunks so that they begin to melt. Additional polysilicon is added by the delivery system 12 after some of the chunk polysilicon has melted. Initially, the ball valve 96 is closed and the feed tube 44 is positioned above the ball valve as shown in FIG. 3. The hopper 30 and delivery system 12 are brought to a vacuum pressure in an inert gas environment and the ball valve is opened. The feed tube 44 is lowered to dock in the bell shaped upper end 42 of the delivery tube 32 as shown in FIG. 2.

By turning the handle 90, the delivery tube 32 is swung to position the outlet portion 40 at a selected radial position relative to the open top of the crucible 20. Typically, the outlet portion 40 would be positioned about over the center of the crucible 20 (as shown in FIG. 1). Fluid bed polysilicon is then fed from the hopper 30 down the feed tube 44, into the delivery tube 32 and out into the crucible 20. The distance D the feed tube 44 is inserted into the delivery tube 32 inhibits escape of the fluid bed polysilicon from the delivery tube. However, grains of polysilicon which do escape the feed tube 44 or delivery tube 32 are permitted to flow through the rotor assembly 48 between the sleeve 64 and the delivery tube. Thus, polysilicon does not readily collect in the rotor assembly 48 further inhibiting jamming of the rotor assembly.

Polysilicon entering the delivery tube 32 flows gently down the angled portion 38 of the tube, but without clogging because the angle β the angled portion makes with the horizontal is greater than the angle of repose of the material. The outlet portion 40 and bulbous end 140 of the delivery tube 32 redirect the polysilicon to a vertical path so that the polysilicon exits the outlet portion in a substantially columnar stream. Thus, the fluid bed polysilicon is less likely to bounce out of the crucible 20. The bulbous portion also inhibits clogging at the outlet portion 40.

When the melt is complete the delivery tube 32 can be swung beyond the periphery of the open top of the crucible 20 using the handle 90. The center of the growth chamber 18 is now open for growing a monocrystalline silicon ingot from the melt. The delivery tube 32 may be positioned near the periphery of the open top of the crucible 20 for adding more fluid bed polysilicon to the melt in the course of growing multiple crystals ("Continuous Recharge Czochralski"). The movement of the delivery tube 32 to any radial position over the open top of the crucible 20 is achieved while maintaining the end of the outlet portion 40 in the same horizontal plane. Thus, polysilicon is dropped from the same height over the crucible 20 regardless of its radial position Moreover, a minimal amount of space in the furnace 10 is required to permit movement of the delivery tube 32.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A furnace system for use in melting a solid material, the furnace system comprising:
   a furnace shell for substantially isolating the interior of the furnace shell;
   a crucible disposed within the furnace shell for holding the solid material to be melted, the crucible being constructed for receiving material through the top thereof and having a central axis of rotation;
   a heat source disposed within the furnace shell for heating the crucible;
   a solid material delivery system for feeding flowable solid material, the delivery system comprising a delivery tube at least partially disposed within the furnace shell generally above the crucible, the delivery tube having an outlet and being constructed for receiving the solid material from a source outside the furnace shell, means mounting the delivery tube for swinging motion relative to the furnace shell by which swinging motion the distance of the delivery tube outlet from the central axis of the crucible is selectively changed, and an actuator for actuating said swinging motion of the delivery tube to selectively position the delivery tube outlet.

2. A furnace system as set forth in claim 1 wherein said mounting means mounts a portion of the delivery tube for rotation about an axis, said mounting means being constructed to compensate for deformation of said mounting means by thermal forces caused by operation of the furnace system so as to keep said delivery tube free for said swinging motion at all operation temperatures of the furnace system.

3. A furnace system as set forth in claim 2 wherein said mounting means comprises a rotor operatively connected to said delivery tube portion for conjoint rotation therewith, and bearing means supporting the rotor for rotation relative to the furnace shell, the rotor being constructed for thermal deformation compensation of said mounting means to keep the rotor free for rotation.

4. A furnace system as set forth in claim 3 wherein the rotor comprises first and second sheaves constructed and arranged to define a space between the sheaves for receiving a portion of said bearing means therebetween, the first and second sheaves being capable of relative motion to vary the size of the space between the sheaves.

5. A furnace system as set forth in claim 4 wherein the second sheave is mounted on the first sheave for movement relative to the first sheave.

6. A furnace system as set forth in claim 5 wherein said mounting means further comprises means for biasing the first and second sheaves toward one another.

7. A furnace system as set forth in claim 6 wherein said bearing means comprises a plurality of wheels mounted for rotation about substantially parallel axes, the wheels being positioned so that a portion of each wheel is received between and engages the first and second sheaves of the rotor.

8. A furnace system as set forth in claim 1 wherein said mounting means further comprises anti-jam means for inhibiting collection of particulate solid material in said mounting means.

9. A furnace system as set forth in claim 8 wherein said anti-jam means comprises a sleeve constructed for holding the delivery tube for conjoint rotation with the sleeve while permitting particulate solid material to flow through said mounting means.

10. A furnace system as set forth in claim 9 wherein the sleeve has spaced apart internal ribs extending longitudinally of the sleeve for engaging the delivery tube, adjacent ribs defining spaces therebetween for flow of particulate solid material through the sleeve between the delivery tube and sleeve.

11. A furnace system as set forth in claim 10 wherein the delivery tube comprises a bell shaped upper end having an outer surface engaging the internal ribs of the sleeve generally adjacent one end of the sleeve, a lower portion having an outer surface engaging the internal ribs of the sleeve generally adjacent an opposite end of the sleeve, and an intermediate portion between the upper end of the delivery tube and the lower portion, the intermediate portion being everywhere spaced from the internal ribs of the sleeve.

12. A furnace system as set forth in claim 11 wherein the sleeve has first bayonet connector elements and the delivery tube has second bayonet connector elements, the first and second connector elements being constructed for bayonet connection of the delivery tube to the sleeve.

13. A furnace system as set forth in claim 12 wherein the first bayonet connector elements each comprise a generally inverted J-shaped slot, and wherein the second bayonet connector elements each comprise a peg projecting laterally outwardly from the delivery tube, the peg being sized for reception in the J-shaped slot and to space the delivery tube from the sleeve to connect the delivery tube but to permit flow of particulate past the peg.

14. A furnace system as set forth in claim 1 wherein the delivery tube comprises an angled portion extending laterally outwardly and downwardly from said mounting means, the angled portion being held by said mounting means such that the downward angle said angled portion makes with the horizontal is greater than the angle of repose of the solid material and less than the angle of repose of the solid material plus about 10°.

15. A furnace system as set forth in claim 14 wherein the downward angle said angled portion makes with the horizontal is greater than the angle of repose of the solid material and less than the angle of repose of the solid material plus about 5°.

16. A furnace system as set forth in claim 15 wherein the downward angle said angled portion makes with the horizontal is greater than the angle of repose of the solid material and less than the angle of repose of the solid material plus about 2°.

17. A furnace system as set forth in claim 1 wherein the delivery tube comprises an angled portion having a centerline, and an outlet portion having a centerline extending generally downwardly at an angle to the centerline of the angled portion, the ratio of the length to the diameter of the outlet portion being at least about 1°.

18. A furnace system as set forth in claim 17 wherein the angled portion has a bulbous end extending beyond the outlet portion.

19. A furnace system as set forth in claim 18 wherein the bulbous end is a generally spherical section having a center at the intersection of the centerlines of the angled portion and the outlet portion, and has a radius equal to the radius of the angled portion.

20. A furnace system as set forth in claim 1 wherein the solid material delivery system further comprises, the source of the solid material, a feed tube for delivering the solid material from the source to the delivery tube, the feed tube being mounted for generally axial motion between a docked position in which the feed tube extends into an upper end of the delivery tube and an undocked position in which the feed tube is spaced from the upper end of the delivery tube.

21. A furnace system as set forth in claim 20 wherein the upper end of the delivery tube is generally bell shaped, an interior surface of the upper end of the delivery tube and an exterior surface of the feed tube having a maximum radial spacing in the docked position, the feed tube in the docked position being inserted a distance into the upper end of the delivery tube equal to approximately 30 times said maximum radial spacing.

22. A furnace system as set forth in claim 21 wherein said maximum radial spacing is selected to be greater than a maximum particle size of the source material.

23. A furnace system as set forth in claim 22 wherein a smallest gap between the feed tube and the delivery tube in the docked position is selected to be less than the smallest particle size of the source material.

24. A furnace system as set forth in claim 23 wherein the gap between the feed tube and the delivery tube is approximately equal to one tenth the maximum radial spacing.

25. A furnace system as set forth in claim 24 wherein the external diameter of the feed tube is approximately equal to the internal diameter of the delivery tube below the upper end, less an amount equal to the tolerance for the material of the delivery tube.

26. A furnace system as set forth in claim 21 wherein the internal diameter of the delivery tube below the bell shaped upper end of the delivery tube is substantially constant for a distance equal to approximately 10 of said internal diameters of the delivery tube.

27. A solid material delivery system for feeding solid material from a source into a furnace for melting the solid material, the furnace having a shell and a crucible capable of rotation about a central axis of rotation, the solid material delivery system comprising a delivery tube adapted to be at least partially disposed within the furnace shell generally above the crucible, the delivery tube having an outlet and being constructed for receiving the solid material from the source outside the furnace, means mounting the delivery tube for swinging motion relative to the furnace by which swinging motion the distance of the delivery tube outlet from the central axis of the crucible may be selectively changed, and an actuator for actuating said swinging motion of the delivery tube to selectively radially position the delivery tube outlet, said mounting means mounting a portion of the delivery tube for rotation about an axis, said mounting means being constructed to compensate for deformation of said mounting means by thermal forces caused by operation of the furnace so as to keep said delivery tube free for said swinging motion at all operation temperatures of the furnace.

28. A solid material delivery system as set forth in claim 27 wherein said mounting means comprises a rotor operatively connected to said delivery tube portion for conjoint rotation therewith, and bearing means supporting the rotor for rotation relative to the furnace shell, the rotor being constructed for thermal deformation compensation to keep the rotor free for rotation, the rotor comprising first and second sheaves constructed and arranged to define a space between the sheaves for receiving a portion of said bearing means therebetween, the first and second sheaves being capable of relative motion to vary the spacing between the sheaves.

29. A solid material delivery system as set forth in claim 28 wherein the second sheave is mounted on the first sheave for movement relative to the first sheave, and wherein said mounting means further comprises means for biasing the first and second sheaves toward one another.

30. A solid material delivery system as set forth in claim 29 wherein said bearing means comprises a plurality of wheels mounted for rotation about substantially parallel axes, the wheels being positioned so that a portion of each wheel is received between and engages the first and second sheaves of the rotor.

31. A solid material delivery system as set forth in claim 27 wherein said mounting means further comprises anti-jam means for inhibiting collection of particulate solid material in said mounting means, said anti-jam means comprising a sleeve constructed for holding the delivery tube for conjoint rotation with the sleeve while permitting particulate solid material to flow through said mounting means.

32. A solid material delivery system as set forth in claim 31 wherein the sleeve has spaced apart internal ribs extending longitudinally of the sleeve for engaging the delivery tube, adjacent ribs defining spaces therebetween for flow of particulate solid material through the sleeve between the delivery tube and sleeve.

33. A solid material delivery system as set forth in claim 32 wherein the delivery tube comprises a bell shaped upper end having an outer surface engaging the internal ribs of the sleeve generally adjacent one end of the sleeve, a lower portion having an outer surface engaging the internal ribs of the sleeve generally adjacent an opposite end of the sleeve, and an intermediate portion between the upper end of the delivery tube and the lower portion, the intermediate portion being everywhere spaced from the internal ribs of the sleeve.

34. A solid material delivery system as set forth in claim 33 wherein the sleeve has first bayonet connector elements and the delivery tube has second bayonet connector elements, the first and second connector elements being constructed for bayonet connection of the delivery tube to the sleeve, the first bayonet connector elements each comprising a generally inverted J-shaped slot, the second bayonet connector elements each comprising a peg projecting laterally outwardly from the delivery tube, the peg being sized for reception in the J-shaped slot and to space the delivery tube from the sleeve to connect the delivery tube but to permit flow of particulate past the peg.

35. A solid material delivery system as set forth in claim 27 wherein the delivery tube comprises an angled portion extending laterally outwardly and downwardly from said mounting means, the angled portion being held by said mounting means such that the downward angle said angled portion makes with the horizontal is greater than the angle of repose of the solid material and less than the angle of repose of the solid material plus about 5°.

36. A solid material delivery system as set forth in claim 35 wherein the downward angle said angled portion makes with the horizontal is greater than the angle of repose of the solid material and less than the angle of repose of the solid material plus about 2°.

37. A solid material delivery system as set forth in claim 27 wherein the delivery tube comprises an angled portion having a centerline, and an outlet portion having a centerline extending generally downwardly at an angle to the centerline of the angled portion, the ratio of the length to the diameter of the outlet portion being at least about 1.

38. A solid material delivery system as set forth in claim 37 wherein the angled portion has a bulbous end extending beyond the outlet portion, the bulbous end being a generally spherical section having a center at the intersection of the centerlines of the angled portion and the outlet portion, and having a radius equal to the radius of the angled portion.

39. A solid material delivery system as set forth in claim 27 further comprising the source of solid material, and a feed tube for delivering the solid material from the source to the delivery tube, the feed tube being mounted for generally axial motion between a docked position in which the feed tube extends into an upper end of the delivery tube and an undocked position in which the feed tube is spaced from the upper end of the delivery tube.

40. A solid material delivery system as set forth in claim 39 wherein the upper end of the delivery tube is generally bell shaped, an interior surface of the upper end of the delivery tube and an exterior surface of the feed tube having a maximum radial spacing in the docked position, the feed tube in the docked position being inserted a distance into the upper end of the delivery tube equal to approximately 30 times said maximum radial spacing.

41. A solid material delivery system as set forth in claim 40 wherein said maximum radial spacing is selected to be greater than a maximum particle size of the source material.

42. A solid material delivery system as set forth in claim 41 a smallest gap between the feed tube and the delivery tube in the docked position is selected to be less than the smallest particle size of the source material.

43. A solid material delivery system as set forth in claim 41 wherein the gap between the feed tube and the delivery tube is approximately equal to one tenth the maximum radial spacing.

44. A solid material delivery system as set forth in claim 43 wherein the external diameter of the feed tube is approximately equal to the internal diameter of the delivery tube below the upper end, less an amount equal to the tolerance for the material of the delivery tube.

45. A solid material delivery system as set forth in claim 40 wherein the internal diameter of the delivery tube below the bell shaped upper end of the delivery tube is substantially constant for a distance equal to approximately 10 of said internal diameters of the delivery tube.

46. A solid material delivery system for feeding solid material from a source into a furnace for melting the solid material, the furnace having a shell and a crucible capable of rotation about a central axis of rotation, the solid material delivery system comprising a delivery tube adapted to be at least partially disposed within the furnace shell generally above the crucible, the delivery tube having an outlet and being constructed for receiving the solid material from the source outside the furnace, means mounting the delivery tube for swinging motion relative to the furnace by which swinging motion the distance of the delivery tube outlet from the central axis of the crucible may be selectively changed, and an actuator for actuating said swinging motion of the delivery tube to selectively radially position the delivery tube outlet, said mounting means further comprising anti-jam means for inhibiting collection of particulate solid material in said mounting means.

47. A solid material delivery system as set forth in claim 46 wherein said anti-jam means comprises a sleeve constructed for holding the delivery tube for conjoint rotation with the sleeve while permitting particulate solid material to flow through said mounting means.

48. A solid material delivery system as set forth in claim 47 wherein the sleeve has spaced apart internal ribs extending longitudinally of the sleeve for engaging the delivery tube, adjacent ribs defining spaces therebetween for flow of particulate solid material through the sleeve between the delivery tube and sleeve.

49. A solid material delivery system as set forth in claim 48 wherein the delivery tube comprises a bell shaped upper end having an outer surface engaging the internal ribs of the sleeve generally adjacent one end of the sleeve, a lower portion having an outer surface engaging the internal ribs of the sleeve generally adjacent an opposite end of the sleeve, and an intermediate portion between the upper end of the delivery tube and the lower portion, the intermediate portion being everywhere spaced from the internal ribs of the sleeve.

50. A solid material delivery system as set forth in claim 49 wherein the sleeve has first bayonet connector elements and the delivery tube has second bayonet connector elements, the first and second connectors elements being constructed for bayonet connection of the delivery tube to the sleeve.

51. A solid material delivery system as set forth in claim 50 wherein the first bayonet connector elements each comprise a generally inverted J-shaped slot, and wherein the second bayonet connector elements each comprise a peg projecting laterally outwardly from the delivery tube, the peg being sized for reception in the J-shaped slot and to space the delivery tube from the sleeve to connect the delivery tube but to permit flow of particulate past the peg.

52. A solid material delivery system as set forth in claim 46 wherein the delivery tube comprises an angled portion extending laterally outwardly and downwardly from said mounting means, the angled portion being held by said mounting means such that the downward angle said angled portion makes with the horizontal is greater than the angle of repose of the solid material and less than the angle of repose of the solid material plus about 2°.

53. A solid material delivery system as set forth in claim 46 wherein the delivery tube comprises an angled portion having a centerline, and an outlet portion having a centerline extending generally downwardly at an angle to the centerline of the angled portion, the ratio of the length to the diameter of the outlet portion being at least about 1.

54. A solid material delivery system as set forth in claim 53 wherein the angled portion has a bulbous end extending beyond the outlet portion, the bulbous end being a generally spherical section having a center at the intersection of the centerlines of the angled portion and the outlet portion, and has a radius equal to the radius of the angled portion.

55. A solid material delivery system as set forth in claim 46 wherein the solid material delivery system further comprises, the source of the solid material, a feed tube for delivering the solid material from the source to the delivery tube, the feed tube being mounted for generally axial motion between a docked position in which the feed tube extends into an upper end of the delivery tube and an undocked position in which the feed tube is spaced from the upper end of the delivery tube.

56. A solid material delivery system as set forth in claim 55 wherein the upper end of the delivery tube is generally bell shaped, an interior surface of the upper end of the delivery tube and an exterior surface of the feed tube having a maximum radial spacing in the docked position, the feed tube in the docked position being inserted a distance into the upper end of the delivery tube equal to approximately 30 times said maximum radial spacing, said maximum radial spacing being selected to be greater than a maximum particle size of the source material, and a smallest gap between the feed tube and the delivery tube in the docked position is selected to be less than the smallest particle size of the source material.

57. A solid material delivery system as set forth in claim 55 wherein the internal diameter of the delivery tube below the bell shaped upper end of the delivery tube is substantially constant for a distance equal to approximately 10 of said internal diameters of the delivery tube.

* * * * *